United States Patent
He

(10) Patent No.: US 12,535,277 B2
(45) Date of Patent: Jan. 27, 2026

(54) HEATPIPE WITH GRADUATED CONDENSER PORTION AND CONSTANT RATIO BETWEEN WICK THICKNESS AND CROSS-SECTION AREA

(71) Applicant: Dell Products L.P., Round Rock, TX (US)

(72) Inventor: Qinghong He, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 258 days.

(21) Appl. No.: 18/347,639

(22) Filed: Jul. 6, 2023

(65) Prior Publication Data

US 2025/0012514 A1 Jan. 9, 2025

(51) Int. Cl.
*F28D 15/02* (2006.01)
*F28D 15/04* (2006.01)
*H05K 7/20* (2006.01)

(52) U.S. Cl.
CPC ......... *F28D 15/0233* (2013.01); *F28D 15/04* (2013.01); *H05K 7/20336* (2013.01)

(58) Field of Classification Search
CPC .... F28D 15/0233; F28D 15/04; F28D 15/046; H05K 7/20336
See application file for complete search history.

(56) References Cited

U.S. PATENT DOCUMENTS

| | | | | |
|---|---|---|---|---|
| 3,754,594 A | * | 8/1973 | Ferrell | F28D 15/046 165/272 |
| 4,674,565 A | * | 6/1987 | Beam | F28D 15/046 29/890.032 |
| 6,948,556 B1 | * | 9/2005 | Anderson | F28D 15/043 165/80.4 |
| 2006/0137859 A1 | * | 6/2006 | Lin | F28D 15/046 165/104.33 |
| 2007/0193722 A1 | * | 8/2007 | Hou | F28D 15/0233 165/146 |
| 2007/0193723 A1 | * | 8/2007 | Hou | F28D 15/0233 165/146 |
| 2008/0105406 A1 | * | 5/2008 | Chang | B23P 15/26 165/146 |
| 2010/0077614 A1 | * | 4/2010 | Hou | B22F 7/004 29/890.032 |
| 2010/0155033 A1 | * | 6/2010 | Holley | F28D 15/046 29/890.03 |
| 2013/0092354 A1 | * | 4/2013 | Semenov | F28D 15/04 165/104.26 |
| 2015/0114603 A1 | * | 4/2015 | Pai | H05K 7/20336 165/104.26 |
| 2019/0128619 A1 | * | 5/2019 | Snelling | B29C 33/04 |

(Continued)

*Primary Examiner* — Travis Ruby
(74) *Attorney, Agent, or Firm* — McDermott Will & Schulte LLP

(57) ABSTRACT

In one or more embodiments, one or more systems may comprise a heatpipe with a ratio between a cross-section area for a working fluid and one or more of a tube thickness and a wick thickness that is substantially constant along the length of the heatpipe. A heatpipe may have an evaporator section having a constant longitudinal profile and a condenser portion with a non-constant longitudinal profile. A wick inside the heatpipe may have a thickness based on a position in the heatpipe. The condenser portion may comprise a plurality of sections, with each section having a constant longitudinal profile.

16 Claims, 12 Drawing Sheets

(56) References Cited

U.S. PATENT DOCUMENTS

| | | | |
|---|---|---|---|
| 2021/0262737 A1* | 8/2021 | North | F28D 15/046 |
| 2021/0293486 A1* | 9/2021 | Liu | F28D 15/04 |
| 2022/0082333 A1* | 3/2022 | Liu | F28D 15/04 |
| 2023/0345670 A1* | 10/2023 | Lin | F28D 15/046 |

* cited by examiner

HEATPIPE WITH GRADUATED CONDENSER PORTION AND CONSTANT RATIO BETWEEN WICK THICKNESS AND CROSS-SECTION AREA

BACKGROUND

Field of the Disclosure

This disclosure relates generally to information handling systems and more particularly to cooling components with a heatpipe with a graduated condenser portion and a constant ratio of wick thickness and cross-section area to transfer heat to a heat exchanger.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Embodiments may be generally directed to a heatpipe for transferring heat from a heat source to a heat exchanger in a chassis. The heatpipe may comprise a tube with a tube thickness, the tube comprising an evaporator portion coupled to the heat source and a condenser portion coupled to the heat exchanger, wherein the tube has a graduated longitudinal profile in the condenser portion; a wick inside the tube, the wick having a wick thickness; and a working fluid inside the tube, wherein a ratio between a cross-section area for the working fluid and one or more of the tube thickness and the wick thickness is substantially constant at every position along the length of the heatpipe.

In some embodiments, the graduated longitudinal profile in the condenser portion comprises a stepped longitudinal profile having a plurality of sections, wherein each section has a section cross-section area that is constant, wherein the wick thickness is constant in each section. In some embodiments, a section cross-section area is based on a heat transfer rate for the section. In some embodiments, the tube thickness is constant over the length of the heatpipe. In some embodiments, the graduated longitudinal profile in the condenser portion comprises a tapered longitudinal profile.

Embodiments may also be directed to a cooling system for a chassis in an information handling system. The cooling system may comprise a heat exchanger and a heatpipe, the heatpipe comprising a tube with a tube thickness, the tube comprising an evaporator portion coupled to the heat source and a condenser portion coupled to the heat exchanger, wherein the tube has a graduated longitudinal profile in the condenser portion; a wick inside the tube, the wick having a wick thickness; and a working fluid inside the tube, wherein a ratio between a cross-section area for the working fluid and one or more of the tube thickness and the wick thickness is substantially constant at every position along the length of the heatpipe.

In some embodiments, the graduated longitudinal profile in the condenser portion comprises a stepped longitudinal profile having a plurality of sections, wherein each section has a section cross-section area that is constant, wherein the wick thickness is constant in each section. In some embodiments, a section cross-section area is based on a heat transfer rate for the section. In some embodiments, the tube thickness is constant over the length of the heatpipe. In some embodiments, the graduated longitudinal profile of the condenser portion comprises a tapered longitudinal profile.

Embodiments may also be directed to a method of forming a heatpipe for a chassis, the method comprising forming a tube blank with a cross-section area that is substantially constant between a first end of the tube blank and a second end of the tube blank; positioning an insert in the tube blank, wherein the tube blank has a graduated longitudinal profile; deposing a wicking material in the tube blank; compressing the tube blank to form a tube with a tube thickness and a condenser portion having a graduated longitudinal profile and a wick having a wick thickness; removing the insert from the tube; deposing a working fluid in the tube; and sealing the tube to form a heatpipe, wherein a ratio between a cross-section area for the working fluid and one or more of the tube thickness and the wick thickness is substantially constant along the length of the heatpipe.

In some embodiments, the insert comprises a plurality of insert segments, each insert segment having a constant cross-section profile, wherein compressing the tube blank relative to the insert forms the condenser portion having a plurality of sections, each section having a constant cross-section area for the working fluid. In some embodiments, compressing the tube blank relative to the insert forms the wick at a position along the length of the heatpipe with the wick thickness based on the cross-section area for the working fluid at that position. In some embodiments, the cross-section area for each section is based on a heat transfer rate for the section. In some embodiments, the tube thickness is constant over the length of the heatpipe. In some embodiments, the graduated longitudinal profile of the condenser portion comprises a tapered longitudinal profile.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1:
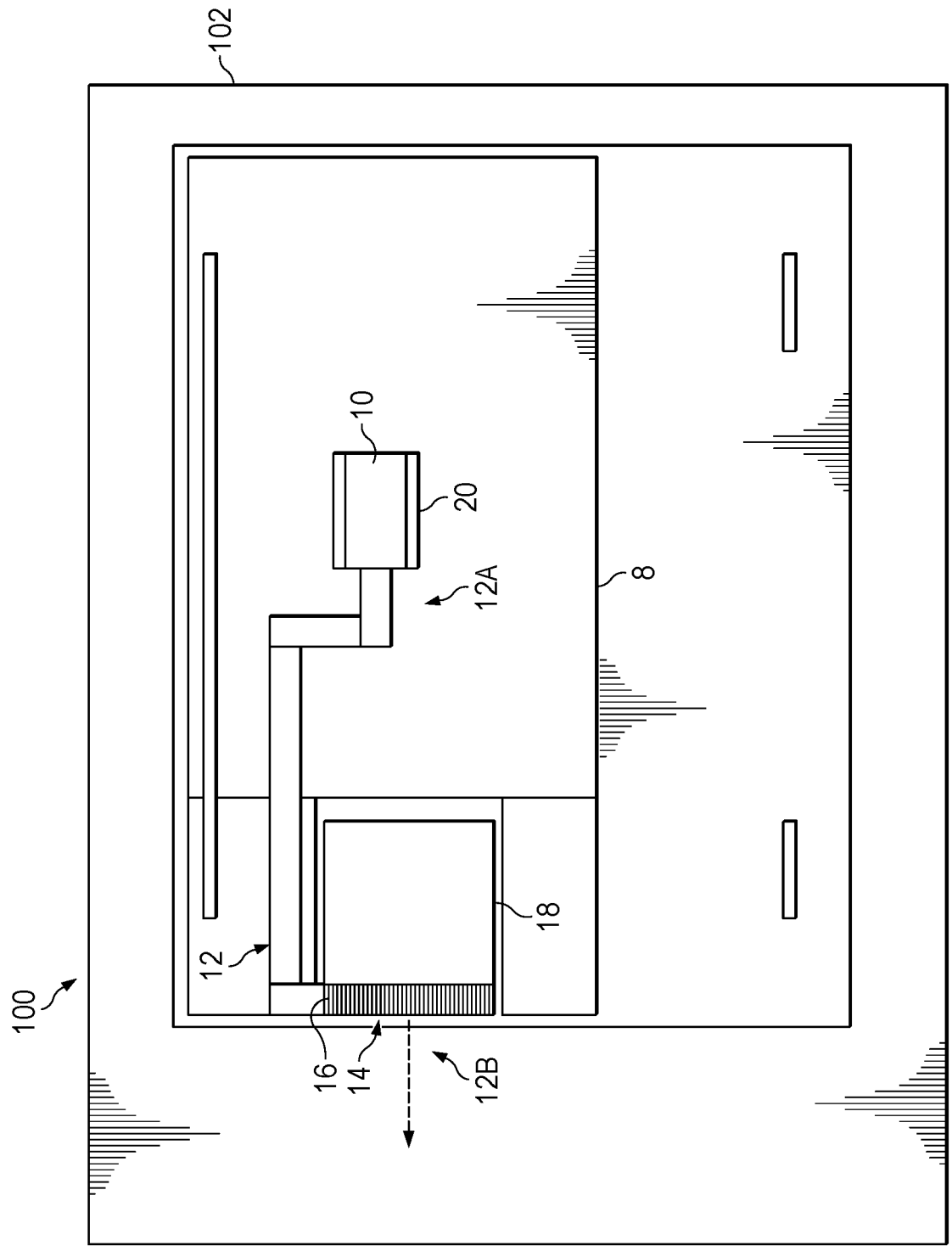
FIG. 1 depicts a top view of a chassis of an information handling system with a cooling system.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

An information handling system (IHS) may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, an IHS may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS may include or have a form factor of that of or similar to one or more of a laptop, a notebook, a telephone, a tablet, and a PDA, among others. For example, a portable IHS may be readily carried and/or transported by a user (e.g., a person). In one or more embodiments, components of an IHS may include one or more storage devices, one or more communications ports for communicating with external devices as well as various input and output (I/O) devices, such as a keyboard, a mouse, and a video display, among others. In one or more embodiments, IHS may include one or more buses operable to transmit communication between or among two or more hardware components. In one example, a bus of an IHS may include one or more of a memory bus, a peripheral bus, and a local bus, among others. In another example, a bus of an IHS may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, an IHS may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

An IHS may include a processor, a volatile memory medium, non-volatile memory media, an I/O subsystem, and a network interface. Volatile memory medium, non-volatile memory media, I/O subsystem, and network interface may be communicatively coupled to processor. In one or more embodiments, one or more of volatile memory medium, non-volatile memory media, I/O subsystem, and network interface may be communicatively coupled to processor via one or more buses, one or more switches, and/or one or more root complexes, among others. In one example, one or more of a volatile memory medium, non-volatile memory media, an I/O subsystem, and a network interface may be communicatively coupled to the processor via one or more PCI-Express (PCIe) root complexes. In another example, one or more of an I/O subsystem and a network interface may be communicatively coupled to processor via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

A volatile memory medium may include volatile storage such as, for example, RAM, DRAM (dynamic RAM), EDO RAM (extended data out RAM), SRAM (static RAM), etc. One or more of non-volatile memory media may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, a network interface may be utilized in communicating with one or more networks and/or one or more other information handling systems. In one example, network interface may enable an IHS to communicate via a network utilizing a suitable transmission protocol and/or standard. In a second example, a network interface may be coupled to a wired network. In a third example, a network interface may be coupled to an optical network. In another example, a network interface may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, a network interface may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, a processor may execute processor instructions in implementing at least a portion of one or more systems, at least a portion of one or more flowcharts, at least a portion of one or more methods, and/or at least a portion of one or more processes. In one example, a processor may execute processor instructions from one or more memory media in implementing at least a portion of one or more systems, at least a portion of one or more flowcharts, at least a portion of one or more methods, and/or at least a portion of one or more processes. In another example, a processor may execute processor instructions via a network interface in implementing at least a portion of one or more systems, at least a portion of one or more flowcharts, at least a portion of one or more methods, and/or at least a portion of one or more processes.

In one or more embodiments, a processor may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, a processor may interpret and/or execute program instructions and/or process data stored locally (e.g., via memory media and/or another component of an IHS). In another example, a processor may interpret and/or execute program instructions and/or process data stored remotely (e.g., via a network storage resource).

In one or more embodiments, an I/O subsystem may represent a variety of communication interfaces, graphics interfaces, video interfaces, user input interfaces, and/or peripheral interfaces, among others. For example, an I/O subsystem may include one or more of a touch panel and a display adapter, among others. For instance, a touch panel may include circuitry that enables touch functionality in conjunction with a display that is driven by a display adapter.

A non-volatile memory medium may include an operating system (OS) and applications (APPs). In one or more embodiments, one or more of an OS and APPs may include processor instructions executable by a processor. In one example, a processor may execute processor instructions of one or more of OS and APPs via a non-volatile memory medium. In another example, one or more portions of the processor instructions of one or more of an OS and APPs may be transferred to a volatile memory medium and a processor may execute the one or more portions of the processor instructions.

Non-volatile memory medium may include information handling system firmware (IHSFW). In one or more embodiments, IHSFW may include processor instructions executable by a processor. For example, IHSFW may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, a processor may execute processor instructions of IHSFW via non-volatile memory medium. In another instance, one or more portions of the processor instructions of IHSFW may be transferred to volatile memory medium, and processor may execute the one or more portions of the processor instructions of IHSFW via volatile memory medium.

Embodiments may effectively remove heat from a chassis and may also reduce materials needed to manufacture an efficient cooling system.

Figure 2A:
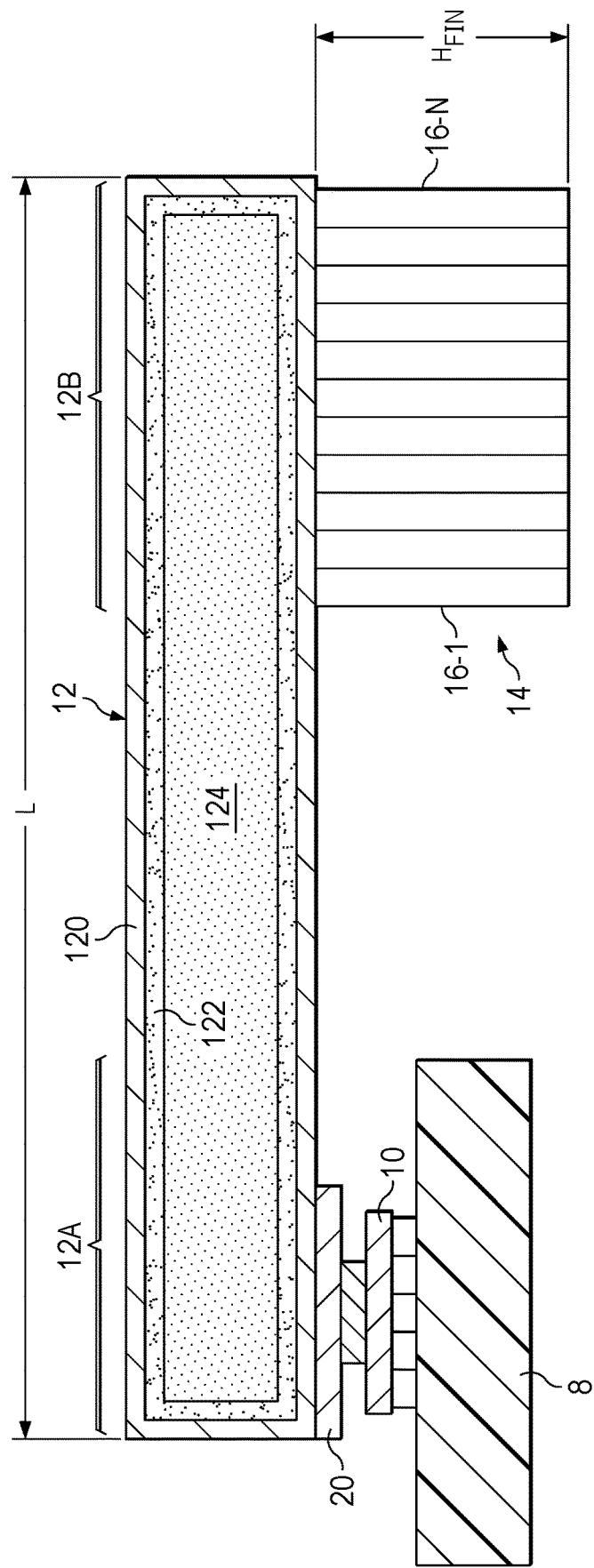
FIG. 2A depicts a partial side view of an example chassis of a portable information handling system with a cooling system for transferring heat from heat source to a heat exchanger, the system comprising a heatpipe with a constant tube thickness, a constant wick thickness and a constant cross-section area over the length of the heatpipe.

Turning now to FIGS. 1 and 2A, a portable information handling system 100 comprises chassis 102 containing mainboard 8 comprising a plurality of components 10 that generate heat when operating. For example, component 10 may be a processor such as a central processing unit (CPU) that generates heat when processing information. In some chassis 102, heat transfer from component 10 to heatpipe 12 may occur through heat spreader 20. A common approach to removing heat from chassis 102 comprises transferring heat from component 10 through heatpipe 12 to heat exchanger 14 having a plurality of fins 16, wherein airflow generated by fan 18 transfers heat from fins 16 to an ambient environment. A first portion 12A of heatpipe 12 may also be referred to as an evaporator portion 12A and a second portion 12B of heatpipe 12 may also be referred to as a condenser portion 12B. Heatpipe 12 may contain bends or turns to accommodate fan 18 and other components in chassis 102.

Figure 2B:
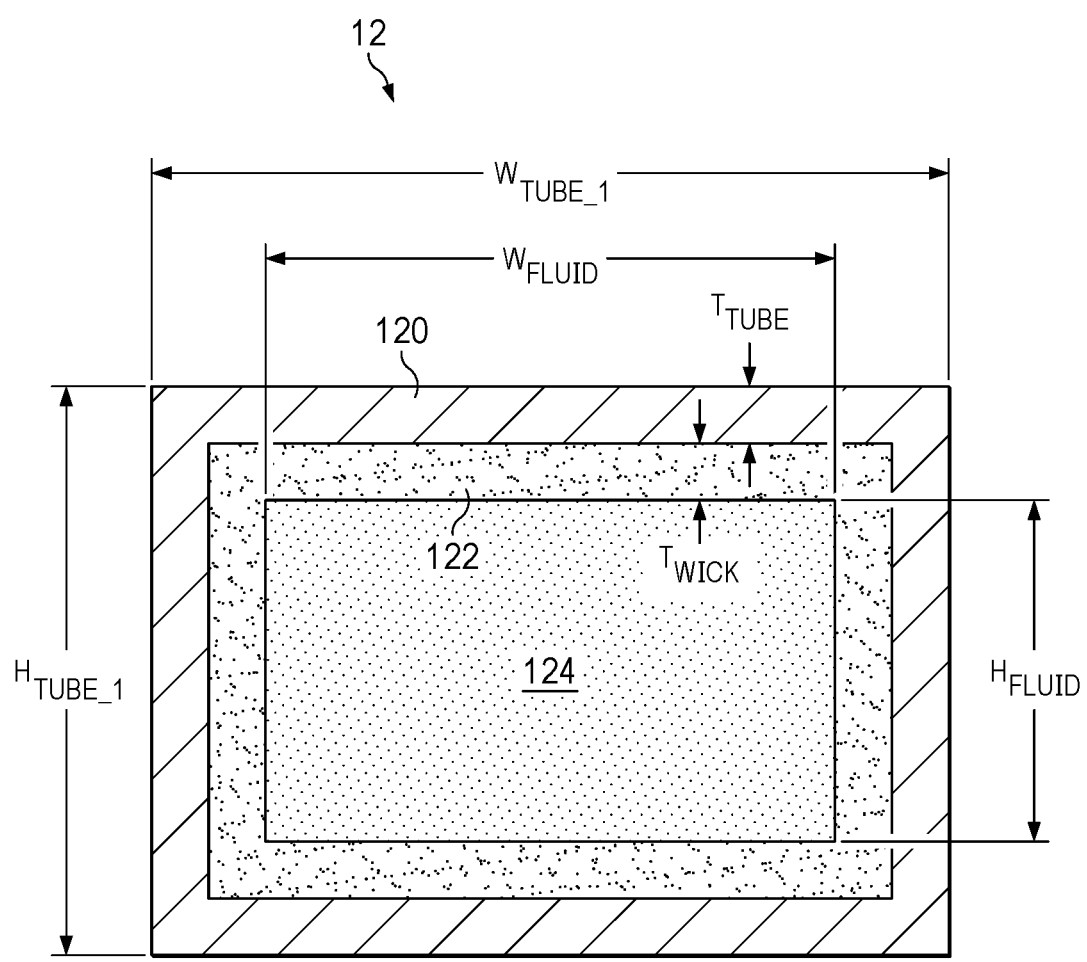
FIG. 2B depicts a cross-section view of a heatpipe depicted in FIG. 2A, wherein the cross-section area, the wick thickness and the tube thickness are substantially constant over the length of the heatpipe depicted in FIG. 2A.

Referring to FIGS. 1, 2A and 2B, heatpipes 12 are typically formed with tube 120 having a constant tube thickness ($T_{TUBE}$) over length (L) of heatpipe 12, wick 122 having a constant wick thickness ($T_{WICK}$) over length (L) and a volume for working fluid 124 inside tube 120. As depicted in FIG. 2A, heat exchangers 14 typically comprise a plurality of fins 16 of constant fin height ($H_{FIN}$), wherein $H_{FIN}$ for a first fin 16-1 may be the same as $H_{FIN}$ for any fin 16-N in fin stack 14. The volume inside tube 120 for working fluid 124 may be defined by a cross-section area of the inside of tube 120 and the length (L) of tube 120. As depicted in FIG. 2B, a cross-section profile of heatpipe 12 may be generally rectangular for example, wherein the volume for working fluid 124 may be defined by a cross-section area having height ($H_{FLUID}$) and a width ($W_{FLUID}$) inside tube 120.

Figure 3A:
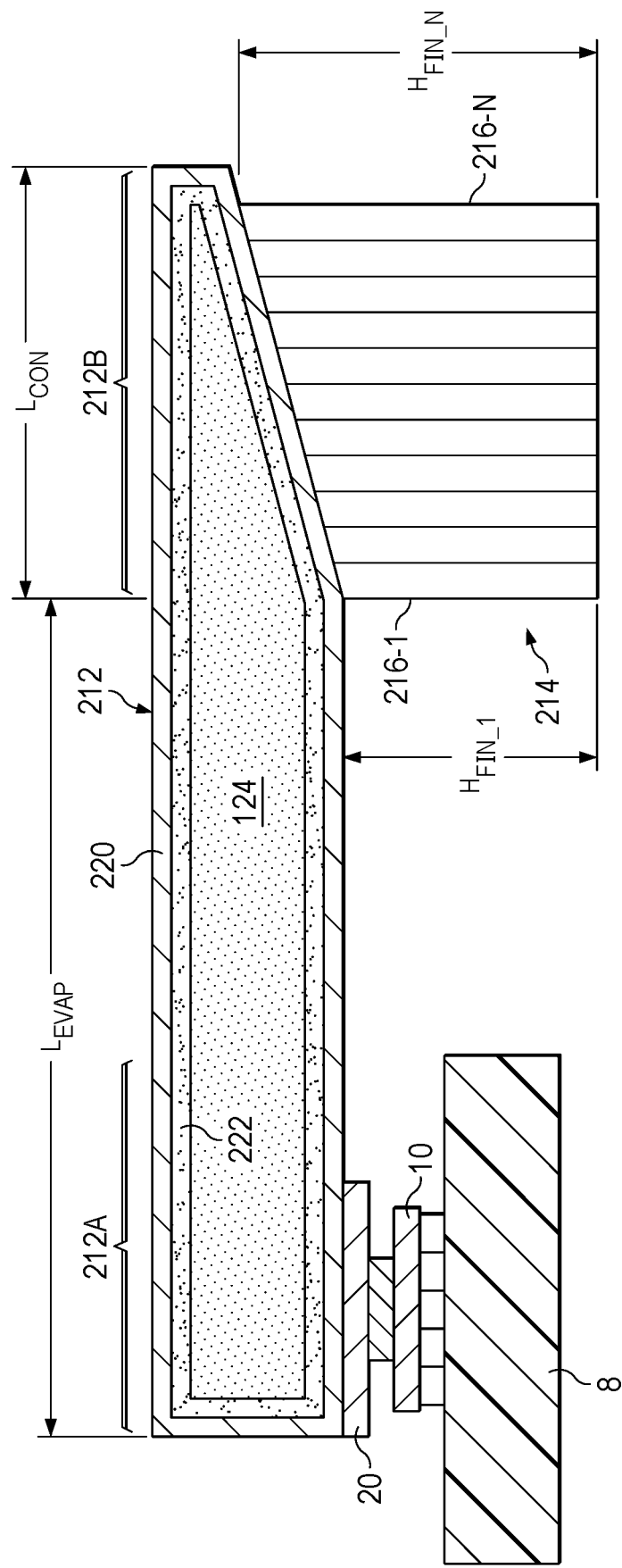
FIG. 3A depicts a partial side view of an example chassis of a portable information handling system with a cooling system for transferring heat from heat source to a heat exchanger, the system comprising a heatpipe with a constant tube thickness and a constant wick thickness over the length of the heatpipe but a cross-section area that decreases between a heat source and a heat exchanger.

Referring to FIGS. 1 and 3A, another approach to removing heat from chassis 102 of a portable information handling system 100 comprises heatpipe 212 with an evaporator portion 212A coupled to component 10 (which may involve heat spreader 20 thermally coupling component 10 to heatpipe 212) and a condenser portion 212B with a decreasing longitudinal profile coupled to heat exchanger 214, wherein heat exchanger 214 is configured such that a height for each fin 216 varies based on the position of fin 216 (e.g., $H_{FIN}$ for fin 16-2 is greater than $H_{FIN}$ for fin 16-1, $H_{FIN}$ for fin 16-3 is greater than $H_{FIN}$ for fin 16-2, . . . $H_{FIN}$ for fin 16-N is greater than $H_{FIN}$ for fin 16-N−1).

Figure 3B:
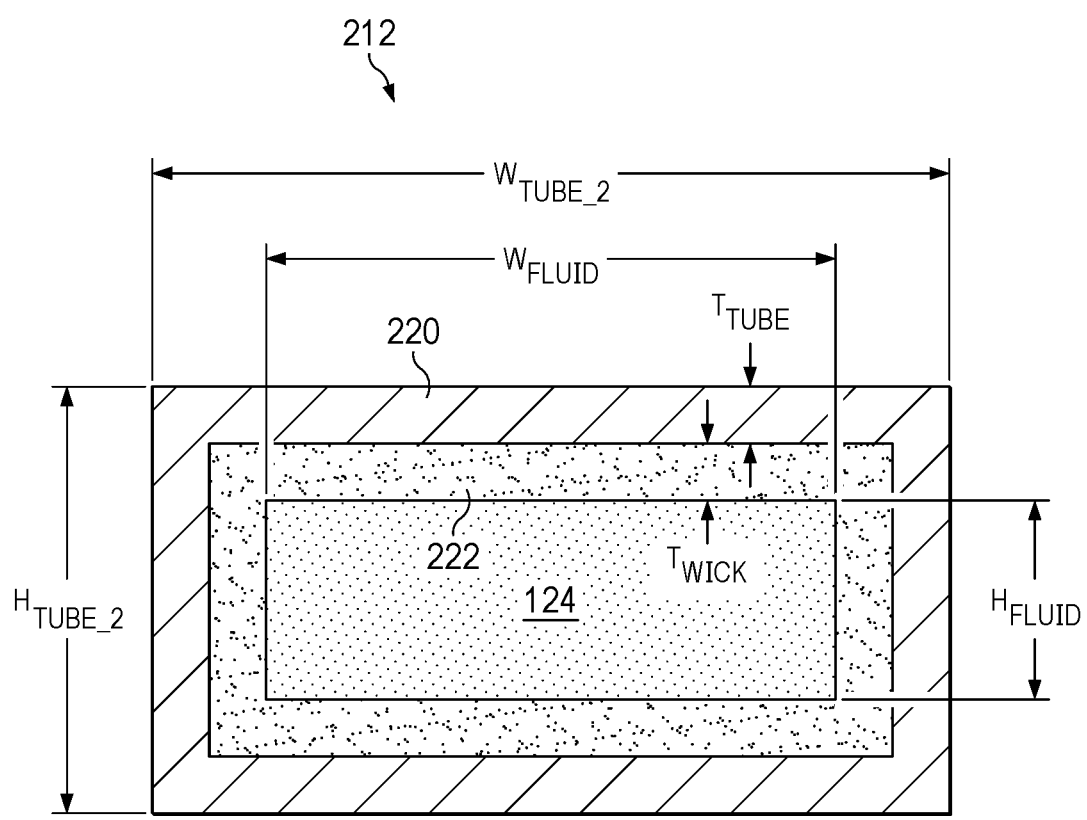
FIG. 3B depicts a cross-section view of the heatpipe depicted in FIG. 2A at a position relative to a heat exchanger, illustrating how compressing the tube changes a ratio between the cross-section area for the working fluid and one or more of the tube thickness and the wick thickness.

Referring to FIGS. 3A and 3B, a cross-section profile of heatpipe 212 over a first length (e.g., $L_{EVAP}$) from evaporator portion 212A to heat exchanger 214 may be constant and the cross-section area for working fluid 124 may be substantially the same as the cross-section area for working fluid 124 associated with heatpipe 12 depicted in FIG. 2B. However, some approaches to forming heatpipe 212 involve forming tube 120 with a substantially constant profile and then compressing the condenser portion 212B of tube 120 to form a non-constant (e.g., tapered) longitudinal profile along a second length (e.g., $L_{CON}$) corresponding to heat exchanger 214. Comparing the example cross-section profiles depicted in FIGS. 2B and 3B, the height of tube 120 may decrease (e.g., $H_{TUBE\_2}$ may be less than $H_{TUBE\_1}$), the width of tube 120 may be unchanged (e.g., $W_{TUBE\_2}$ may be the same as $W_{TUBE\_1}$) and the tube thickness ($T_{TUBE}$) and wick thickness ($T_{WICK}$) may be substantially unchanged, but the cross-section area available for working fluid 124 is smaller (e.g., $H_{FLUID}$ may decrease), which may negatively affect heat transfer capabilities of heatpipe 212.

A Constant Ratio Between Cross-Section Area for a Working Fluid and One or More of Tube Thickness and Wick Thickness Improves Heat Transfer Referring to FIGS. 4, 5A-5D, and 6-8, Embodiments Disclosed Herein May Comprise heatpipe 312 configured with a graduated condenser portion 312B, wherein a ratio between the cross-section area for working fluid 124 and one or more of the tube thickness and the wick thickness is substantially constant for all positions over the length of heatpipe 312. In some embodiments, a ratio between the cross-section area for working fluid 124 and one or more of the tube thickness and the wick thickness is constant regardless of the longitudinal profile of heatpipe 312. Thus, if one or more outer dimensions (e.g., a height, width or diameter) of heatpipe 312 changes, one or more of the tube thickness and the wick thickness may also be changed such that a ratio between the cross-section area for working fluid 124 and one or more of the tube thickness and the wick thickness remains constant over the length of heatpipe 312.

A Heatpipe May have a Constant Tube Thickness, Wick Thickness and Cross-Section Area Between a First End and a Heat Exchanger In some embodiments, heatpipe 312 may have a generally constant cross-section profile between a first end and a heat exchanger 314. Between the first end and heat exchanger 314, tube 320 may have a constant tube thickness and wick 322 may have a constant wick thickness and heatpipe 312 may have a constant cross-section area for working fluid 124. Accordingly, a ratio between the cross-section area for working fluid 124 and one or more of the tube thickness and the wick thickness is substantially constant between the first end of heatpipe 312 and heat exchanger 314.

A Condenser Portion of a Heatpipe has a Graduated Longitudinal Profile

Figure 4:
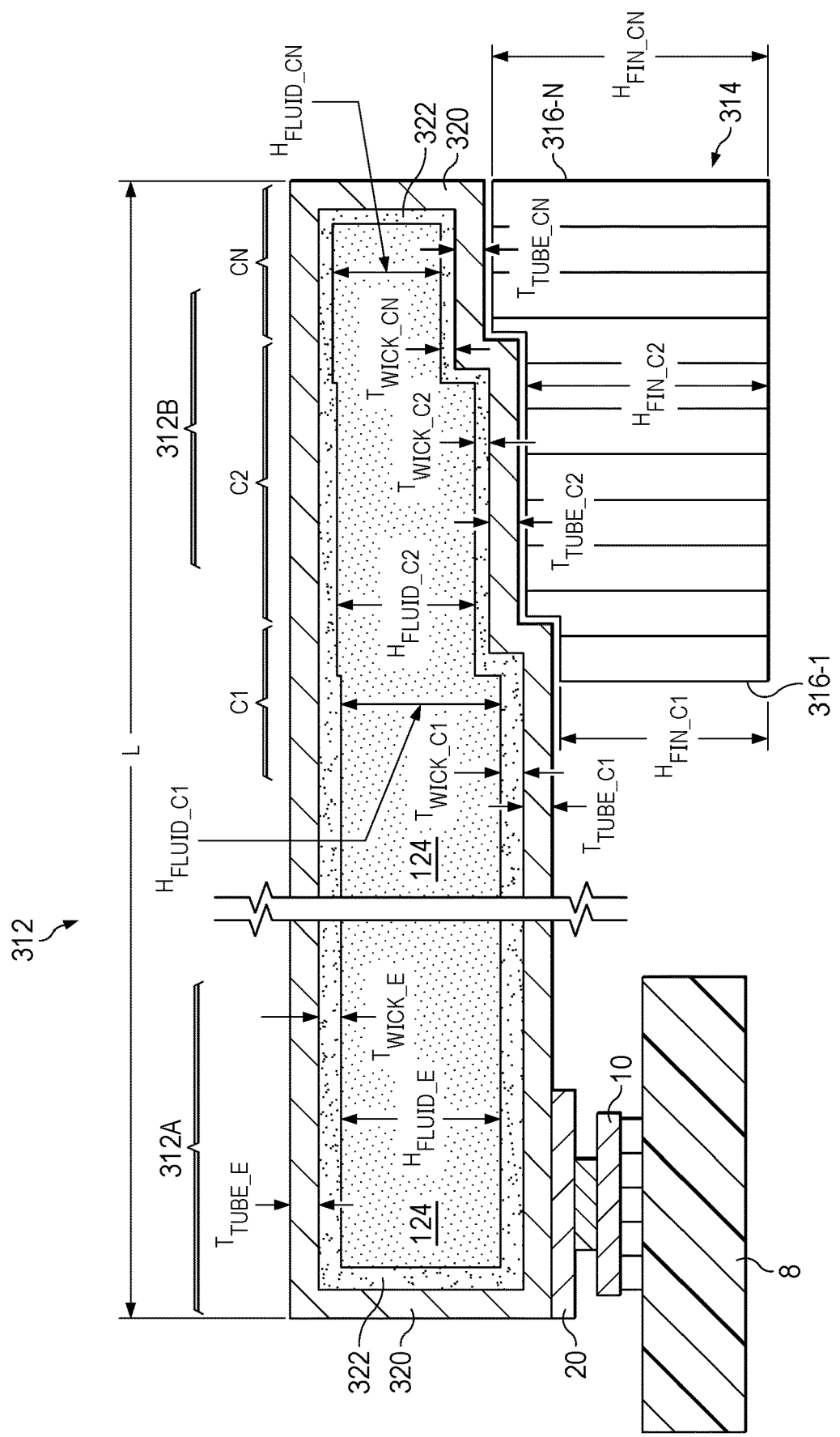
FIG. 4 depicts a partial side view of an example chassis of a portable information handling system with a cooling system comprising a heatpipe with a graduated condenser portion coupled to a stepped heat exchanger in accordance with some embodiments.

Still referring to FIG. 4, heatpipe 312 may further comprise condenser portion 312B formed with condenser portion 312B having a graduated longitudinal profile, wherein a graduated longitudinal profile may refer to a longitudinal profile in which a cross-section profile of heatpipe 312 may be non-constant but a ratio between the cross-section area for working fluid 124 and one or more of the tube thickness and the wick thickness remains substantially constant at all positions over the length of heatpipe 312. In some embodiments, condenser portion 312B may be formed with a plurality (N) of sections (e.g., condenser section C1, condenser section C2, . . . condenser section CN) with each section having a tube thickness, a wick thickness and a volume (e.g., condenser section C1 has tube thickness $T_{TUBE\_C1}$, wick thickness $T_{WICK\_C1}$ and cross-section area for working fluid 124 (represented in FIG. 4 by $H_{FLUID\_C1}$), condenser section C2 has a tube thickness $T_{TUBE\_C2}$, a wick thickness $T_{WICK\_C2}$ and a cross-section area for working fluid 124 (represented in FIG. 4 by $H_{FLUID\_C2}$), etc.), wherein one or more of the tube thickness and the wick thickness may vary but a ratio between the cross-section area for working fluid 124 and one or more of the tube thickness ($T_{TUBE}$) and the wick thickness ($T_{WICK}$) remains substantially constant at all positions over the length (L) of heatpipe 312.

Referring to FIGS. 5A-5D, embodiments may include a method for manufacturing heatpipe 312 having a constant ratio between the cross-section area for working fluid 124 and one or more of the tube thickness ($T_{TUBE}$) and the wick thickness ($T_{WICK}$) at all positions over the length (L) of heatpipe 312.

Figure 5A:
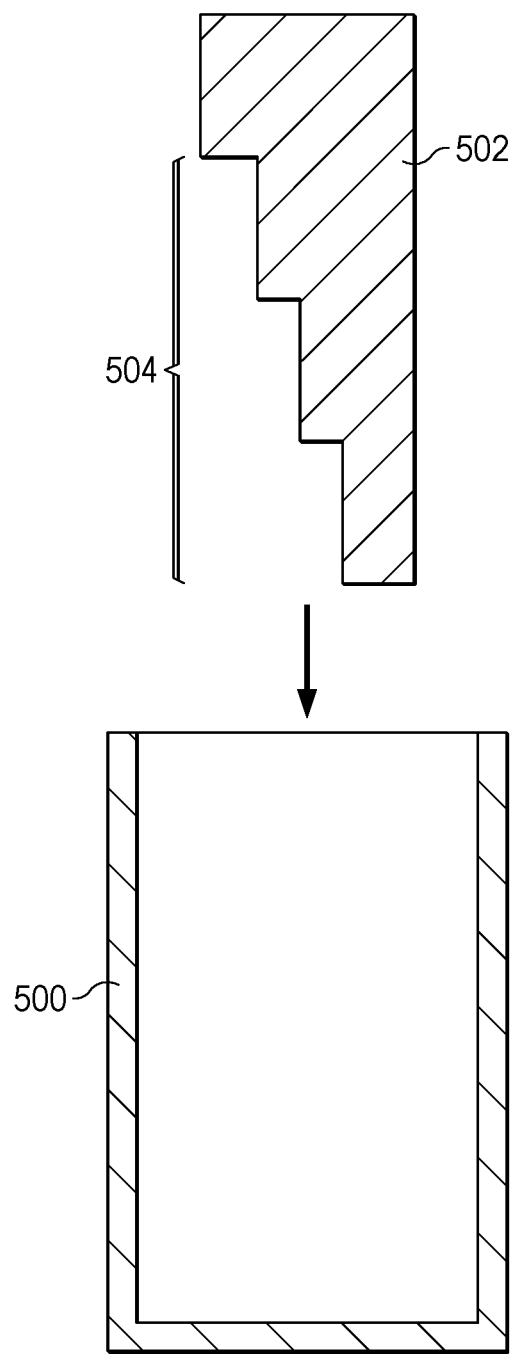
FIGS. 5A-5D depict cutaway side views illustrating steps in a method for manufacturing the heatpipe of FIG. 4.

As depicted in FIG. 5A, embodiments may start with tube blank 500. Tube blank 500 may have a constant tube thickness and/or define a constant cross-section area inside tube blank 500. Inner stamp 502 having a non-constant outer profile 504 may be advanced into tube blank 500. Non-constant outer profile 504 may comprises a plurality of stepped segments of the same segment length or the plurality of segments may have different segment lengths. In some embodiments (described below), non-constant outer profile 504 may be tapered.

Figure 5C:
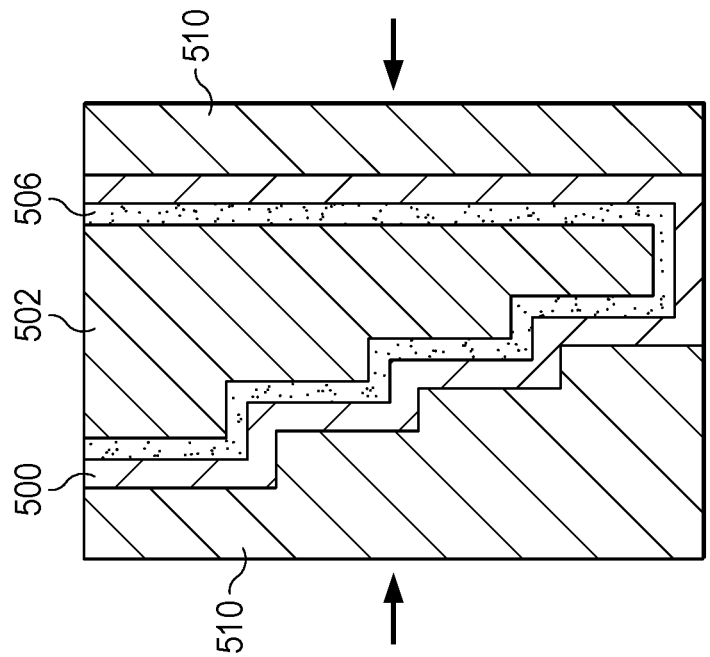
Figure 5B:
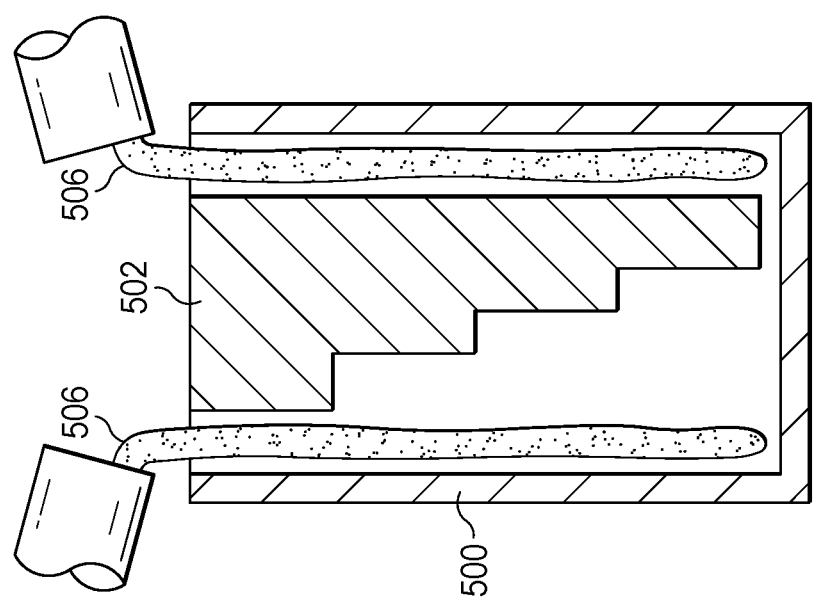

As depicted in FIG. 5B, outer dimensions of inner stamp 502 may be smaller than inner dimensions of tube blank 500 such that there is space between inner stamp 502 and tube blank 500. The space between inner stamp 502 and tube blank 500 may at least partially determine a thickness of wick 322. Once inner stamp 502 is positioned in tube blank 500, wick material 506 may be poured or otherwise deposed in tube blank 500 (e.g., in the space between tube blank 500 and inner stamp 502).

As depicted in FIG. 5C, once wick material 506 is deposed in tube blank 500, outer stamp 510 may be advanced to compress tube blank 500 and wick material 506. In some embodiments, outer stamp 510 and inner stamp 502 may have complementary profiles. In some embodiments, outer stamp 510 and inner stamp 502 may have complementary profiles such that a tube thickness for each section of a condenser portion of a heatpipe has a constant tube thickness.

Figure 5D:
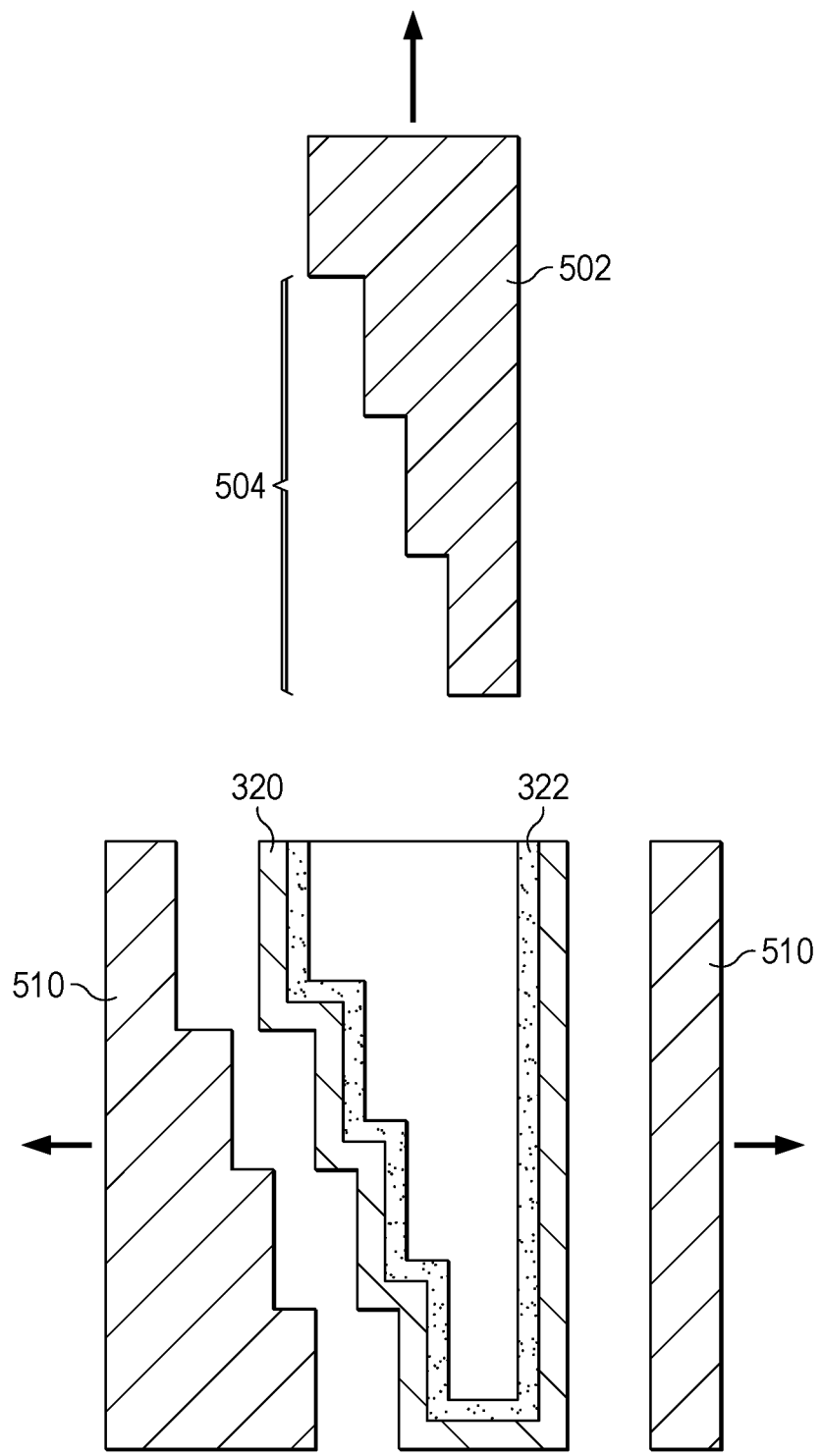

As depicted in FIG. 5D, compressing tube blank 500 forms tube 320 with a non-constant longitudinal profile and forms wick 322 with a wick thickness that may also be non-constant over the length of tube 320, but a ratio between the wick thickness and a cross-section area of the inside of tube 320 may be constant at all positions, including over all condenser sections. Once tube 320 is formed with wick 322, inner stamp 502 and outer stamp 510 may be removed.

Working fluid 124 may be deposed in tube 320 and tube 320 may be sealed to form heatpipe 312, wherein a ratio between the cross-section area for working fluid 124 and one or more of the tube thickness ($T_{TUBE}$) and the wick thickness ($T_{WICK}$) is substantially constant over the length (L) of heatpipe 312.

Figure 6:
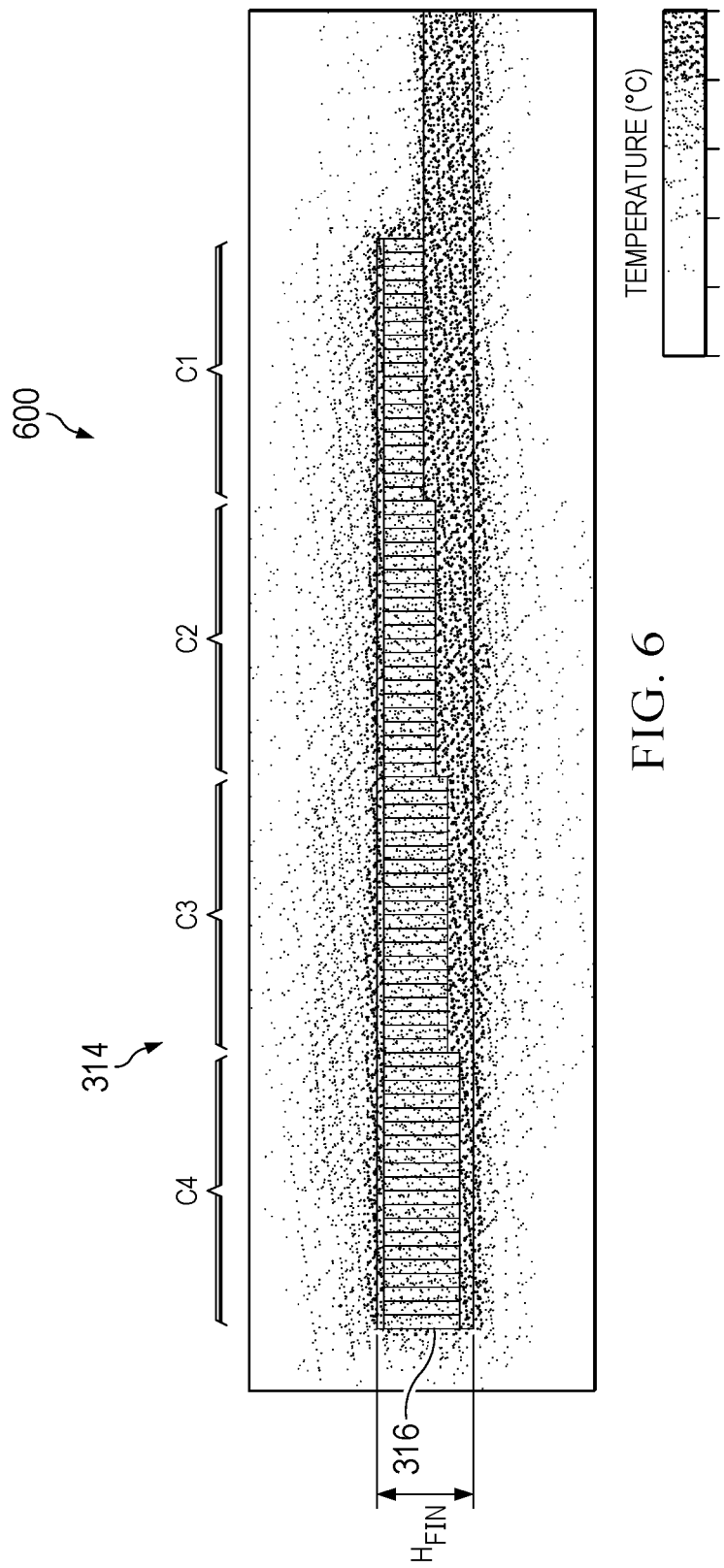
FIG. 6 depicts a thermal simulation profile of a graduated condenser portion of the heatpipe of FIG. 4 and a heat exchanger with fins of stepped heights.
Figure 7:
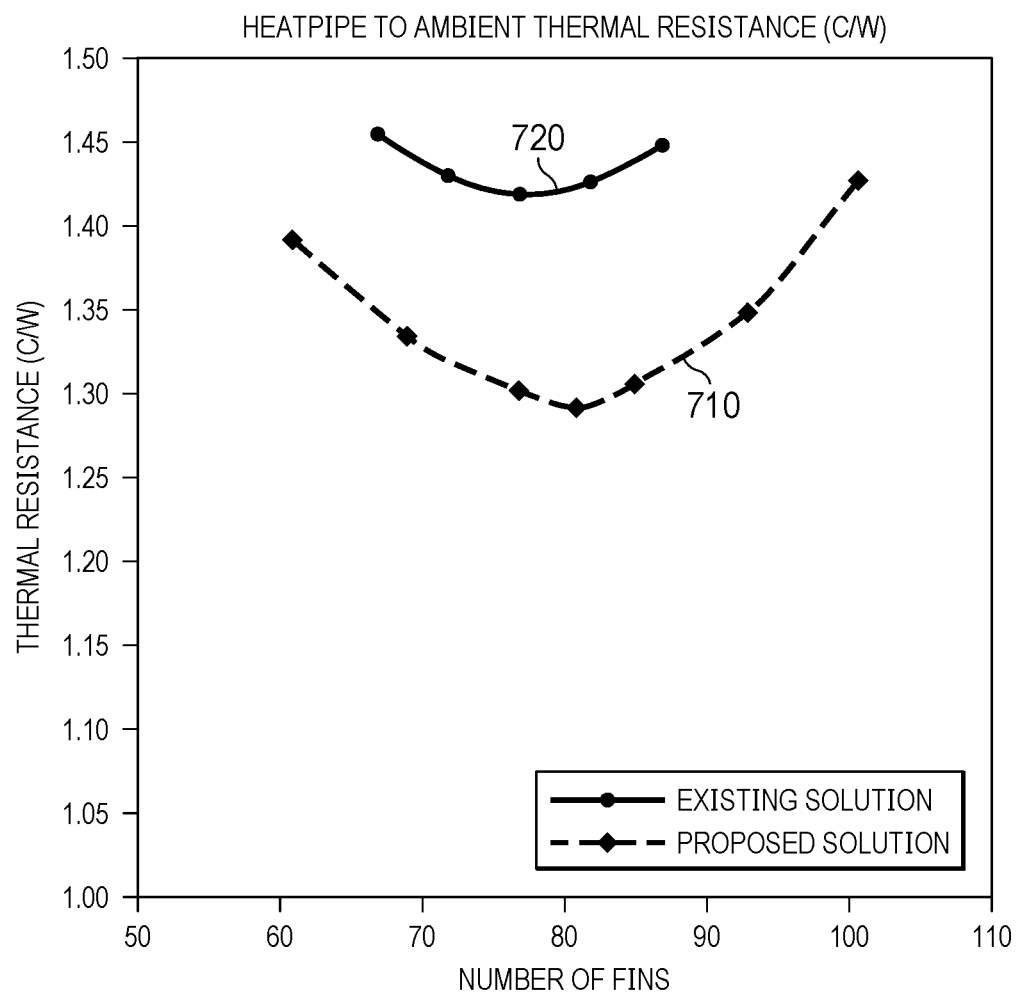
FIG. 7 depicts a graph of thermal resistance relative to the number of fins in a heat exchanger, illustrating reduced thermal resistance for a graduated condenser portion of the heatpipe of FIG. 4 as compared to a heatpipe with a condenser portion having a constant tube thickness, a constant wick thickness and a constant cross-section area.

Advantageously, embodiments may provide better cooling than heatpipes 12 and 212. Referring to Chart 1 and FIGS. 6 and 7, Chart 1 contains values for a simulated comparison between heatpipe 312 and heatpipe 12, FIG. 6 depicts a thermal simulation profile for heatpipe 312 and FIG. 7 depicts a graph of heatpipe to ambient air resistance for different fin configurations. For the comparison, heatpipe 12 is configured with a constant tube height of 2.5 mm and heatpipe 312 is configured with three stepped reductions in tube height (e.g., heatpipe 312 may be configured with a tube height of 2.5 mm from the evaporator portion 312A and in section C1, a tube height of approximately 2.0 mm in section C2, a tube height of approximately 1.6 mm in section C3 and a tube height of approximately 1.1 mm in section C4.

CHART 1

|  | CONSTANT | STEPPED WITH CONSTANT RATIO | CHANGE |
|---|---|---|---|
| HEATPIPE THICKNESS (MM) | 2.5 | 2.5 TO 1.1 |  |
| HEATPIPE TO AMBIENT AIR RESISTANCE (C/W) | 1.42 | 1.29 | 9.1% LOWER |
| NUMBER OF FINS | 77 | 81 | 5% MORE |
| FIN SURFACE AREA (MM^2) | 7308 | 8993 | 23% MORE |
| OPEN SPACE BETWEEN FINS (MM^3) | 191.1 | 223.6 | 17% MORE |
| FAN OPERATING AIRFLOW (CFM) | 1.31 | 1.39 | 6% MORE |
| HEATPIPE TEMPERATURE (C) | 67.8 | 64.2 | 3.6 (LOWER) |

Referring to Chart 1 and FIG. 6, heatpipe 312 with condenser portion 312B having a graduated longitudinal profile (e.g., a ratio between the cross-section area for working fluid 124 and one or more of the tube thickness ($T_{TUBE}$) and the wick thickness ($T_{WICK}$) is constant for all positions along a length of heatpipe 312) may provide better heat transfer over the length of heat exchanger 314.

Referring to Chart 1 and FIG. 7, heatpipe 312 with condenser portion 312B having a graduated longitudinal profile but with a constant ratio between the cross-section area for working fluid 124 and one or more of the tube thickness ($T_{TUBE}$) and the wick thickness ($T_{WICK}$) may have a lower heatpipe to ambient air resistance than for heatpipe 12 over all fin configurations.

As a result of forming heatpipe 312 with a constant ratio between the cross-section area for working fluid 124 and one or more of the tube thickness ($T_{TUBE}$) and the wick thickness ($T_{WICK}$), embodiments may allow heat exchanger 314 to be configured with more fins (e.g., 81 instead of 77), with an increased fin surface area (e.g., 8993 mm^2 or 23% more than 7308 mm^2 for heatpipe 12 having a constant thickness) and with a lower heatpipe to ambient air resistance (e.g., approximately 1.29 C/W instead of approximately 1.42 C/W). Notably, open space between fins 316 may be increased (e.g., 223.6 mm^3 or 17% more than 191.6 mm^3 for heatpipe 12 having a constant longitudinal profile), allowing for more airflow (e.g., approximately 1.39 CFM or 6% more than approximately 1.31 CFM for heatpipe 12 having a constant longitudinal profile). These improvements may allow heatpipe 312 to provide better cooling for components 10 (e.g., approximately 3.6 C cooler than heatpipe 12 having a constant longitudinal profile).

A Graduated Longitudinal Profile is not Limited to a Few Steps

Figure 8:
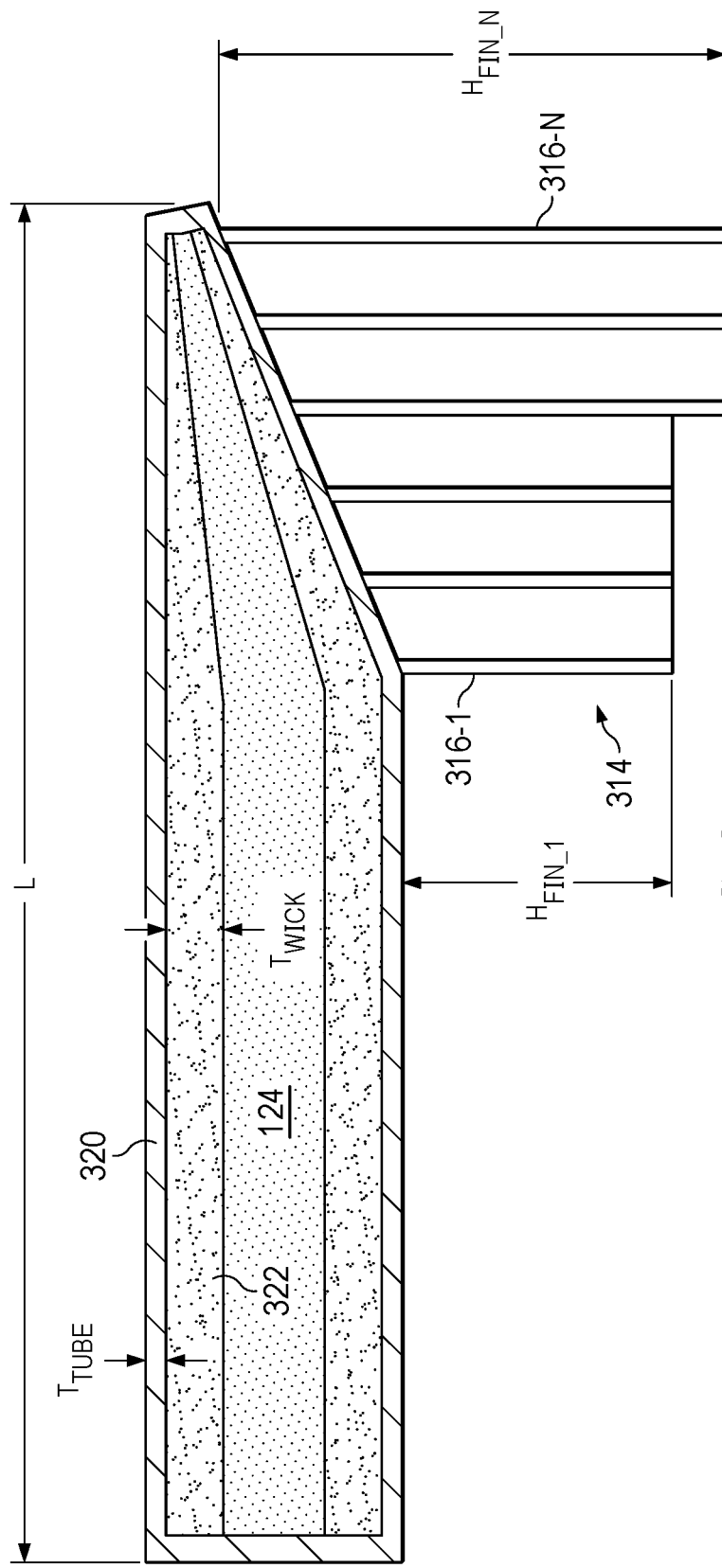
FIG. 8 depicts a cutaway side view of one embodiment of a heatpipe in which the condenser portion has a tapered longitudinal profile with a constant ratio between a cross-section area associated with a volume of a working fluid and one or more of a tube thickness and a wick thickness.

Referring to FIGS. 4 and 8, the number of sections in condenser portion 312B is not limited to only a few steps. In some embodiments, the number of sections in condenser portion 312B may be equal to the number of fins 316 in heat exchanger 314. For example, heat exchanger 314 may have 81 fins and heatpipe 312 may have 81 sections such that the number of fin 316 corresponding to a section may be as few as one. In some embodiments, a condenser portion 312B of heatpipe 12 may be configured with tube 320 and wick 322 having a tapered longitudinal profile, but a ratio between the cross-section area for working fluid 124 and one or more of the tube thickness ($T_{TUBE}$) and the wick thickness ($T_{WICK}$) is substantially constant at every position along a length (L) of heatpipe 312.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A heatpipe for transferring heat from a heat source to a heat exchanger in a chassis, the heatpipe comprising:
    a tube with a tube thickness, the tube comprising an evaporator portion coupled to the heat source and a condenser portion coupled to the heat exchanger, wherein the tube has a graduated longitudinal profile in the condenser portion;
    a wick inside the tube, the wick having a wick thickness; and
    a working fluid inside the tube, wherein
    a ratio between a cross-section area for the working fluid and one or more of the tube thickness and the wick thickness is substantially constant at every position along the length of the heatpipe.

2. The heatpipe of claim 1, wherein the graduated longitudinal profile in the condenser portion comprises a stepped longitudinal profile having a plurality of sections, wherein each section has a section cross-section area that is constant, wherein the wick thickness is constant in each section.

3. The heatpipe of claim 2, wherein a section cross-section area is based on a heat transfer rate for the section.

4. The heatpipe of claim 1, wherein the tube thickness is constant over the length of the heatpipe.

5. The heatpipe of claim 1, wherein the graduated longitudinal profile in the condenser portion comprises a tapered longitudinal profile.

6. A cooling system for a chassis in an information handling system, the cooling system comprising:
    a heat exchanger; and
    a heatpipe, comprising:
    a tube with a tube thickness, the tube comprising an evaporator portion coupled to the heat source and a condenser portion coupled to the heat exchanger, wherein the tube has a graduated longitudinal profile in the condenser portion;
    a wick inside the tube, the wick having a wick thickness; and
    a working fluid inside the tube, wherein
    a ratio between a cross-section area for the working fluid and one or more of the tube thickness and the wick thickness is substantially constant at every position along the length of the heatpipe.

7. The cooling system of claim 6, wherein the graduated longitudinal profile in the condenser portion comprises a stepped longitudinal profile having a plurality of sections, wherein each section has a section cross-section area that is constant, wherein the wick thickness is constant in each section.

8. The cooling system of claim 7, wherein a section cross-section area is based on a heat transfer rate for the section.

9. The cooling system of claim 6, wherein the tube thickness is constant over the length of the heatpipe.

10. The cooling system of claim 6, wherein the graduated longitudinal profile of the condenser portion comprises a tapered longitudinal profile.

11. A method of forming a heatpipe for a chassis, the method comprising:
    forming a tube blank with a cross-section area that is substantially constant between a first end of the tube blank and a second end of the tube blank;
    positioning an insert in the tube blank, wherein the tube blank has a graduated longitudinal profile;
    deposing a wicking material in the tube blank;
    compressing the tube blank to form a tube with a tube thickness and a condenser portion having a graduated longitudinal profile and a wick having a wick thickness;
    removing the insert from the tube;
    deposing a working fluid in the tube; and
    sealing the tube to form a heatpipe, wherein
    a ratio between a cross-section area for the working fluid and one or more of the tube thickness and the wick thickness is substantially constant along the length of the heatpipe.

12. The method of claim 11, wherein
    the insert comprises a plurality of insert segments, each insert segment having a constant cross-section profile; and
    compressing the tube blank relative to the insert forms the condenser portion having a plurality of sections, each section having a constant cross-section area for the working fluid.

13. The method of claim 12, wherein compressing the tube blank relative to the insert forms the wick at a position along the length of the heatpipe with the wick thickness based on the cross-section area for the working fluid at that position.

14. The method of claim 12, wherein the cross-section area for each section is based on a heat transfer rate for the section.

15. The method of claim 12, wherein the tube thickness is constant over the length of the heatpipe.

16. The method of claim 12, wherein the graduated longitudinal profile of the condenser portion comprises a tapered longitudinal profile.

* * * * *